United States Patent [19]

Urai

[11] Patent Number: 5,396,499
[45] Date of Patent: Mar. 7, 1995

[54] SEMICONDUCTOR MEMORY DEVICE WITH REDUNDANT MEMORY AND FLOATABLE DATA LINE

[75] Inventor: Takahiko Urai, Tokyo, Japan

[73] Assignee: NEC Corporation, Tokyo, Japan

[21] Appl. No.: 950,503

[22] Filed: Sep. 25, 1992

[30] Foreign Application Priority Data

Sep. 27, 1991 [JP] Japan .................. 3-277189

[51] Int. Cl.[6] .................. G11C 7/00; G11C 11/40
[52] U.S. Cl. .................. 371/21.1; 365/200;
365/201; 365/189.02; 371/10.2
[58] Field of Search .................. 371/21.1, 27, 10.3,
371/10.2, 21.6, 27; 365/201, 189.01, 189.02, 200

[56] References Cited

U.S. PATENT DOCUMENTS

| | | | |
|---|---|---|---|
| 4,908,798 | 3/1990 | Urai | 365/230.03 |
| 4,914,632 | 4/1990 | Fujishima | 365/200 |
| 4,984,205 | 1/1991 | Sugibayashi | 365/200 |
| 5,034,925 | 7/1991 | Kato | 365/200 |
| 5,097,447 | 3/1992 | Ogawa | 365/200 |
| 5,179,536 | 1/1993 | Kasa | 365/200 |
| 5,195,057 | 3/1993 | Kasa | 365/200 |
| 5,233,610 | 8/1993 | Nakayama | 371/21.1 |
| 5,267,205 | 11/1993 | Hamada | 365/200 |
| 5,278,839 | 1/1994 | Matsumoto | 371/10.2 |
| 5,301,155 | 4/1994 | Wada | 365/201 |
| 5,303,192 | 4/1994 | Baba | 365/200 |
| 5,327,380 | 7/1994 | Kersh, III et al. | 365/195 |

Primary Examiner—Jack B. Harvey
Assistant Examiner—Paul R. Myers
Attorney, Agent, or Firm—Sughrue, Mion, Zinn, Macpeak & Seas

[57] ABSTRACT

A semiconductor memory device provided with a first circuit for storing and accessing data and a second circuit for storing and accessing internal information is disclosed, wherein the data and the internal information, when delivered from the first circuit and the second circuit, respectively, are transmitted through a common data line to an output terminal. The feature is that the second circuit is provided with a code generating circuit for generating test codes representing the internal information, and is arranged between the first circuit and the output terminal. The second circuit is operable in two modes, in the first mode transmitting data read from the first circuit directly to the output port through the common data line without any intervention of the code generating circuit, in the second mode delivering the test codes to the common data line.

5 Claims, 3 Drawing Sheets

SEMICONDUCTOR MEMORY DEVICE WITH REDUNDANT MEMORY AND FLOATABLE DATA LINE

BACKGROUND OF THE INVENTION

1. Field of the Invention

The present invention relates to a semiconductor memory device and in particular to a semiconductor memory device having a normal and redundant memory cells.

2. Description of the Related Art

As the storage capacity of semiconductor devices is enlarged, various measures have been proposed for remedying a memory having a deficient memory cell in order to improve the production yield of the devices. One proposal is to provide redundant memory cells in the devices beforehand to substitute for a possible deficient memory cell.

Ways of arranging redundant memory cells can be classified into two categories: one is to align one or more arrays of redundant memory cells parallel to the normal memory row (the normal memory refers to a memory in the usual sense), while the other is to align the arrays parallel to the normal memory column. In the former, the rows of the redundant memory cells are substituted for the same numbers of normal memory rows together with word lines in case the normal memory rows include a deficient memory cell, while in the latter, the redundant memory array columns are substituted for the same number of normal memory columns together with the column-selecting transistors and the sense amplifiers coupled to the columns.

Hereafter, the memory area to be substituted or by the redundant memory when it includes any deficiency will be referred to as the substitution area. Although not all the memory cells included in the substitution area are deficient, good memory cells contained in the substitution area are also substituted for by the redundant memory so far as the substitution area has at least one deficient memory cell. The good memory cells described above will be referred to as unused memory cells. Thus, in order to efficiently use the normal memory, it is necessary to minimize the number of unused memory cells. This can be attained by making the substitution area as small as possible, i.e., by dividing the entire normal memory into substitution areas of the smallest possible area. However, a large number /f substitution areas requires, if, for example, they are columnarly divided areas, a large number of sense amplifiers, which occupies a large area of the sense amplifiers on the semiconductor chip.

In order to solve this problem, a semiconductor memory device is proposed in U.S. Pat. No. 4,908,798. In this device, arrays of redundant memory cells are directed parallel to the normal memory column. The normal memory is divided into a plurality of columnar memory cell blocks, and each of the blocks is further divided into a plurality of subblocks, each of which is intended for the substitution area defined above. The redundant memory, however, is made of one block which has the same dimension as that of the subblock. The location of a column in a normal memory block is designated by a duplex address made up of a subblock address and an intrasubblock address (the internal address of the subblock), while the location of a column in the redundancy memory is designated by an intrablock address. The intrasubblock address of the normal memory column and the intrablock address of the redundant memory column are both decoded by a single decoder, the first Y-decoder. The subblock address is decoded by an additional decoder, the second Y-decoder. A sense amplifier is provided for every block. Accordingly, a datum read from the redundant memory is supplied directly to the sense amplifier belonging to the redundant memory block.

Addressing a column in a normal memory block is effected by the first and second decoder in accordance with an externally supplied duplex address. A datum read from the addressed column is fed to the relevant sense amplifier (the sense amplifier belonging to the block which includes the addressed column). If the relevant subblock (the subblock which includes the addressed column) does not include any deficient memory cell, then the second Y-decoder controls the switching on of the signal path between the relevant sense amplifier and the I/O terminal. If the addressed subblock includes any deficient memory cell, then the second Y-decoder controls the switching off of the signal path between the I/O terminal and the relevant sense amplifier and the switching on of the signal path between the I/O terminal and the sense amplifier belonging to the redundant memory block, whereby the datum is read from the redundant memory in lieu of the relevant subblock. In this way, since the substitution is carried out through the subblock unit, both fewer sense amplifiers and fewer unused memory cells result.

Many recent semiconductor memory devices are internally provided with circuits necessary for a test mode operation. Some of these devices are of the type in which specified internal data are provided to external circuits. Typical of the internal data is a product-identification code designating the maker and the model of, for example, an EPROM (an erasable programmable read-only memory). This code is accessed, by applying a high voltage to a given pin (for example, pin #A9), by first applying the lowest address (#A0) with the low level and then the high level. Corresponding to the low and high levels of the lowest address (#A0), the maker code and the model code respectively, are accessed. With these codes the programmer can prescribe the conditions to write to the EPROM.

This function of disclosing the maker code and the model code is a function conferred on almost all devices provided with EPROMs. In order to allow this function to be provided to such a device, typically, arrays of a mask ROM which stores the codes are formed next to the normal memory array, the drains of the mask ROM arrays and the normal memory being interconnected so that the mask ROM and the normal memory have common bit lines. The word lines of both memories are controlled so that, when pin #A9 is at the high voltage, all word lines of the mask ROM are activated and all word lines of the normal memory are inactivated, whereby the maker code and the model code are delivered through the bit lines to the exterior.

In the semiconductor memory device provided with redundant memory columns described above, however, when the normal memory columns are substituted with the redundant memory columns, the bit lines coupled to the substituted columns of the normal memory are also substituted, as described above. As a result, the part of the mask ROM coupled to the bit lines in common with the substituted columns of the normal memory becomes unable to be accessed.

This problem arises from the positional relation between the mask ROM and the normal.redundant selector circuit in the flow of data in the device, where the normal-redundant selector circuit is a circuit which switches over the connection between the relevant sense amplifier and the output data line to the connection between the sense amplifier belonging to the redundant memory and the output data line. If the mask ROM is arranged further upstream than the normal.redundant selector circuit, which is the case in the prior art device described above, the data path from the mask ROM to the output data line is switched over by the normal.-redundant selector circuit, preventing data read from the mask ROM from being output.

In order to avoid this situation, it is necessary to arrange the mask ROM further downstream than the normal.redundant selector circuit. FIG. 1 shows a block diagram of a semiconductor memory device of the prior art provided with a redundant memory, in which the logic circuit for generating test codes (designated by reference number 12 as an intermediate buffer in the figure) is arranged further downstreams than normal-redundant selector circuit 9. This circuitry is adopted in the semiconductor memory devices with large storage capacities manufactured by NEC Corp. The arrays of normal memory 1 and redundant memory 2 are coupled to the common word lines, and each word line is designated by a row address signal decoded by common row decoder 3.

Columns in normal memory 1 and redundant memory 2 are selected by column selector circuits 5 and 6, respectively, operated in response to a column address signal decoded by column decoder 4. Data read from the accessed columns are amplified by sense amplifier circuits 7 and 8, and are delivered to data lines Dn and Dr. (While only one data line is shown as data line Dn in FIG. 1, data lines of the same number as that of the sense amplifiers arranged in sense amplifier circuit 7, i.e., the number of the blocks in the normal memory, are actually provided for data line Dn. The data serially read from each of the blocks are amplified by the corresponding sense amplifier and delivered to the data line connected to the sense amplifier.) Redundant address memory 10 stores the addresses of deficient memory cells by means well known in the art. Transfer control circuit 11 compares a supplied address with the address stored in redundant address memory 10 and provides transfer control signal S. Transfer control signal S controls normal.redundant selector circuit (hereinafter, referred to as an NR selector circuit) 9 to transfer the outputs of all sense amplifiers provided in sense amplifier circuit 7 to common data line Data in the case that normal memory 1 does not include any deficient memory cell, and to transfer the outputs of sense amplifier circuit 7 except for the output of the relevant sense amplifier in sense amplifier circuit 7 together with the output of sense amplifier circuit 8 in the case that normal memory 1 includes at least one deficient memory cell. The operation modes of the semiconductor memory device in the former and latter cases will be referred to below as the normal access mode and the substitution mode, respectively. Thus, in the normal access mode, the data read from the normal memory are delivered to data line Data as is, while, in the substitution mode, the data read from the normal memory with the substitution area substituted with the redundant memory are delivered to data line Data.

Code generating intermediate buffer 12 is directed to generating the product identification code and also to playing a role as a buffer register to transmit data from data line Data to data line D. Code generating intermediate buffer 12 includes a logic circuit capable of transmitting data in the normal mode operation and of generating the maker code and the model code in the test mode operation in response to code selection signal T. In order to have;the logic of the data on data line D accord with that of the data on data line Data, code generating intermediate buffer 12 has logic circuits connected in two stages. Code generating intermediate buffer 12 will be referred to as intermediate buffer 12 below.

Code selection control circuit 13 generates code selection signal T in response to voltage signals externally supplied through pins #A9 and #A0.

Code selection signal T controls intermediate buffer 12 so that, if pin #A9 is at 0 V, then intermediate buffer 12 operates in the normal mode, if pin #A9 is applied with a high voltage (typically 12 V) and pin #A0 is supplied with the low level, then intermediate buffer 12 delivers the maker code, and if pin #A9 is applied with the high voltage and pin #A0 is supplied with the high level, then intermediate buffer 12 delivers the model code.

The output signal of intermediate buffer 12 is transmitted through output buffer 14 and output terminal 16 to an external circuit.

A problem encountered in the semiconductor memory device descibed above is that, since at least two stage logic circuits are necessary for the intermediate buffer in order to have the logic of data on the output data line accord with that on the input data line of the intermediate buffer, the transmission time of the data is delayed by the time required to pass the two stage logic circuits, which results in a decrease in the read velocity for the semiconductor memory device.

SUMMARY OF THE INVENTION

It is an object of the present invention to provide a semiconductor memory device with a redundant memory capable of disclosing internal information as test codes and also capable of high speed transmission of data read from the memory.

In order to attain the above object, the semiconductor memory device according to the present invention is provided with first means for storing and accessing data and second means for storing and accessing internal informations, said data and said internal information, when delivered from said first means and said second means, respectively, being transmitted through a common data line to output means, wherein said second means is provided with code generating means for generating test codes representing said internal information, and is arranged between said first means and said output means, said second means being operable in two modes, in the first mode transmitting data read from said first means directly to said output means through said common data line without any intervention of said code generating means, in the second mode delivering said test codes to said common data line.

Since the code generating means is arranged further downstream than the first means, the test code provided by the code generating means is able to be read out without any variance with the first means. Further, since the data read from the memory are transmitted directly to the output means, high-speed transmission is attained.

The above and other objects, features and advantages of the present invention will become apparent from the following description based on the accompanying drawings which illustrate an example of a preferred embodiment of the present invention.

DETAILED DESCRIPTION OF THE PREFERRED EMBODIMENTS

Figure 1:
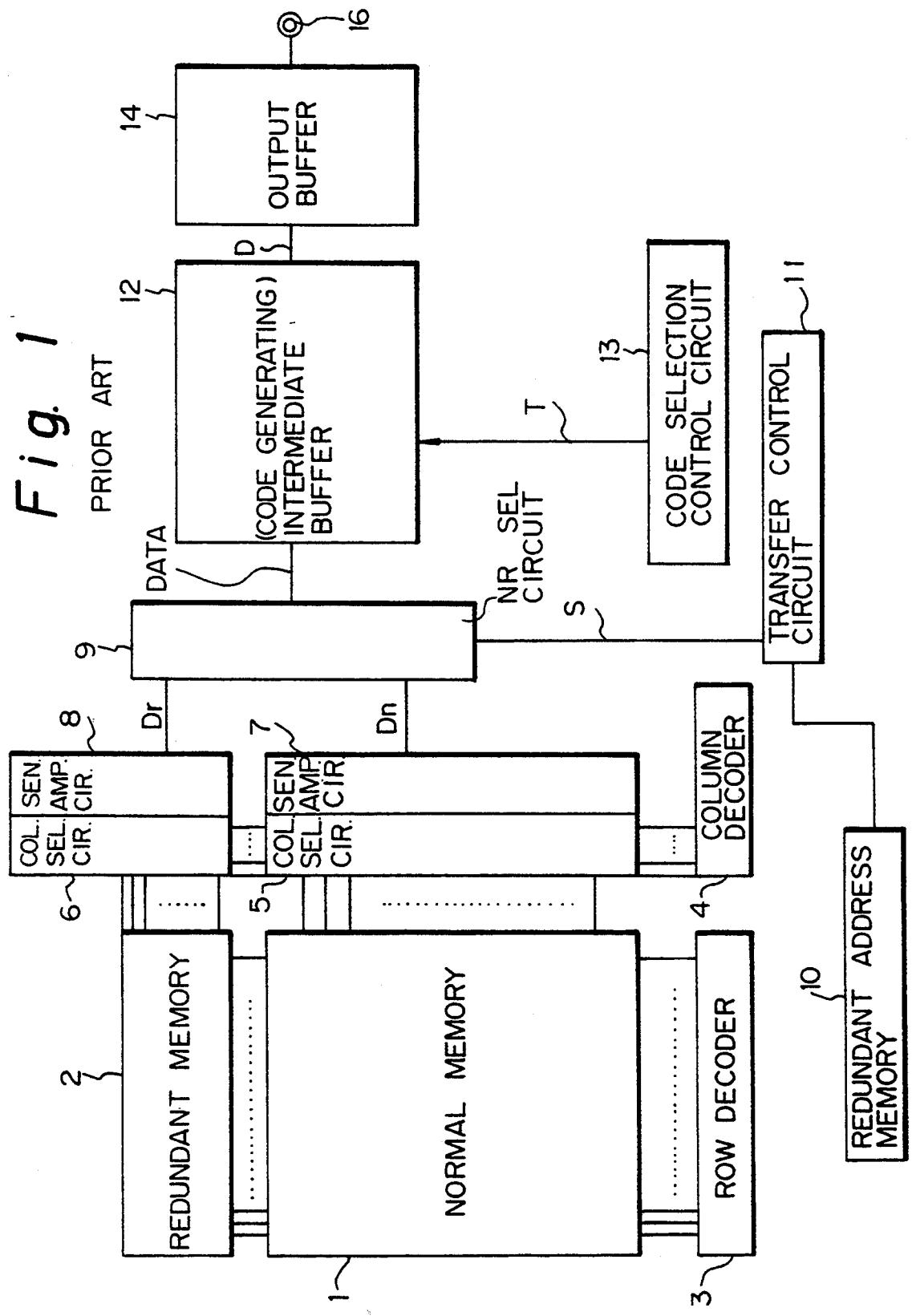
FIG. 1 shows a block diagram of a semiconductor memory device of the prior art provided with a redundant memory.

Referring to the drawings, an explanation of the present invention will be presented below. FIG. 2 shows a block diagram of a first embodiment of the present invention. In FIG. 2, the parts corresponding to those shown in FIG. 1 are denoted by the same reference numbers, and explanations of those parts will be omitted.

Figure 2:
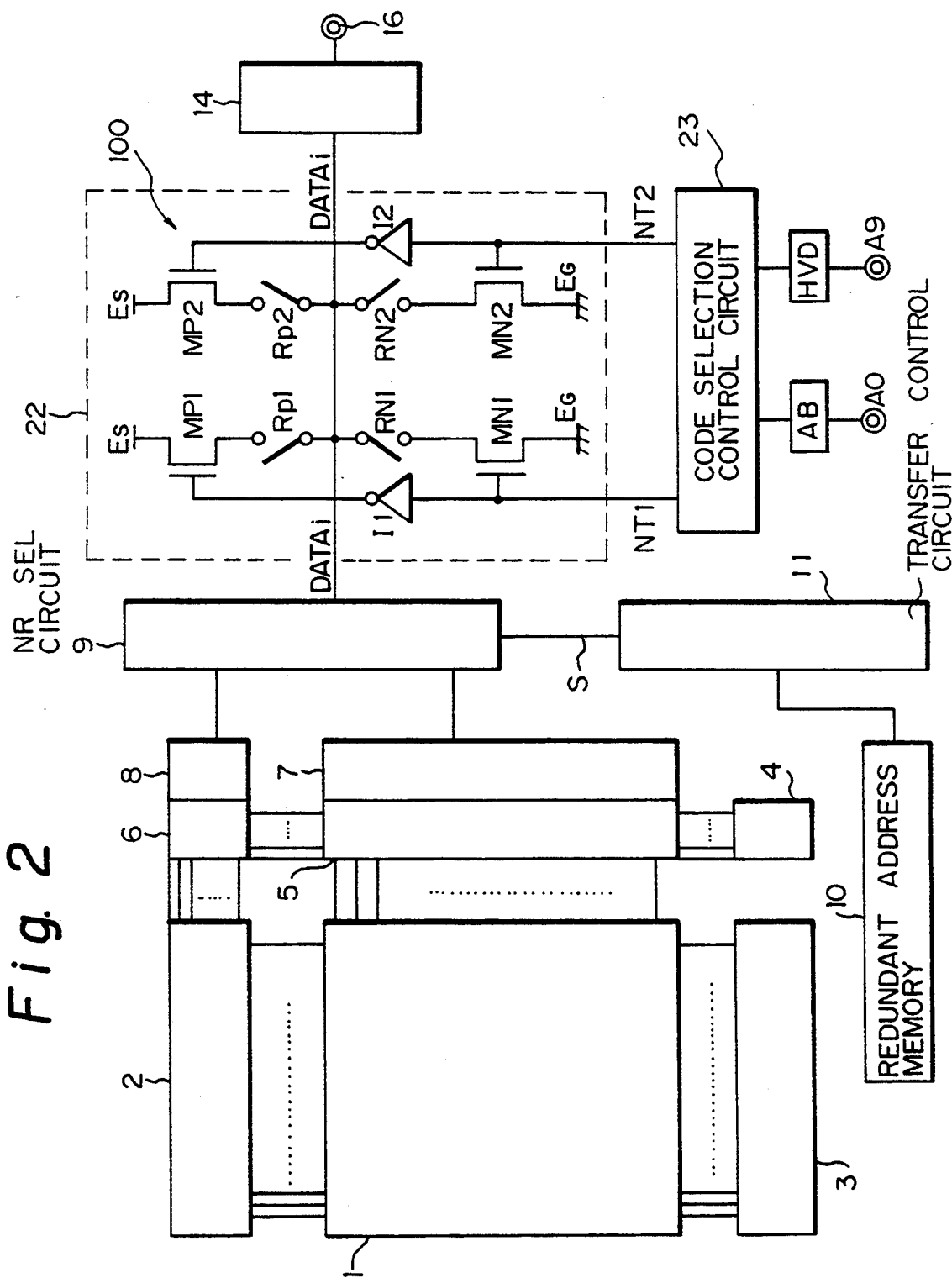
FIG. 2 shows a block diagram of a first embodiment of the present invention.

The basic improvement made in the present semiconductor memory device over the prior art device shown in FIG. 1 is that common data line Datai (i represents a column or bit number) or the input data line of intermediate buffer 22 is connected directly to output 10 buffer 14 without allowing any intervention of the code generating circuit.

In the present embodiment, it is intended that two kinds of the test code, the maker code and the model code, are generated as 8-bit signals. Code generating circuit 100 is made of a 2-row 8-bit ROM. Each cell of the jth (j=1, 2) row of the ROM includes p channel FET MPj with the source connected to high potential electrode $E_S$ of a constant voltage supply and the base connected to word line NTj through inverter Ij and N channel FET MNj with the source connected to grounded low potential electrode $E_G$ and the gate connected to word line NTj. The ROM cell is further provided with connecter members RPj, RNj arranged between common data line Datai and the drains of transistors MPj, MNj, respectively. The connecter member is made of fusing material containing aluminum as the main component. The high and low potentials of the constant voltage supply provide the high and low levels, respectively, of common data line Datai. In FIG. 2, the 1st and 2nd rows of the ith column or the ith bit are shown. A high voltage signal (12 V) for selecting the test mode is supplied to code selection control circuit 23 through pin #A9 and high voltage detector HVD. A signal for designating either the maker code or the model code is also supplied to code selection control circuit 23 through lowest address pin #A0 and 10 address buffer AB. When pin #A9 is at the ground potential code selection control circuit 23 provides both word lines NT1 and NT2 with the low logic level regardless /f the logic level at pin #A0. When pin #A9 is applied with 12 V, code selection control circuit 23 provides the high logic level to word line NT1 and the low logic level to word line NT2, if pin #A0 is supplied with the low logic level, and provides the low logic level to word line NT1 and the high logic level to word line NT2, if pin #A0 is supplied with the high logic level.

TABLE 1

| NT1 | NT2 | RP1 | RP2 | RN1 | RN2 | Datai |
|-----|-----|-----|-----|-----|-----|-------|
| L   | L   | —   | —   | —   | —   | F     |
| H   | L   | D   | —   | C   | —   | L     |
|     |     | C   | —   | D   | —   | H     |
| L   | H   | —   | D   | —   | C   | L     |
|     |     | —   | C   | —   | D   | H     |

F floated from code generating circuit (normal mode)
C connected
D disconnected

In order to illustrate the operation of intermediate buffer 22 according to the present invention, a truth table for the logic level of data line Datai against the truth values of signal lines NT1, NT2 is presented in Table 1. When both word lines NT1 and NT2 are at the low logic level, all transistors MP1, MN1, MP2, MN2 are cut off and common data line Datai becomes floated from code generating circuit 100, which allows the data delivered from NR selector circuit 9 to be directly transmitted to output buffer 14. When code selection control circuit 23 provides, the high logic level to word line NT1, i.e. when word line NT1 is activated in order to obtain the maker code, transistors MP1, MN1 in the 1st row are turned on, which causes common data line Datai to be connected to high or low potential electrode $E_S$ or $E_G$ depending on the way connecter members RP1, RN1 are connected. For example, if the way of connecting the connecter members is prescribed so that connecter member RN1 is connected and connecter member RP1 is disconnected, low potential electrode $E_G$ is communicated to common data line Datai through transistor MN1 and connecter member RN1, whereby the low logic level is established as the logic level of the ith bit of the maker code, as shown in the truth table. Conversely, if the way of connecting the connecter members is prescribed so that connecter member RP1 is connected and connecter member RN1 is disconnected, the high logic level is established in common data line Datai as the logic level of the ith bit of the maker code. Similarly, the model code is accessed by activating 2nd row word line NT2.

Figure 3:
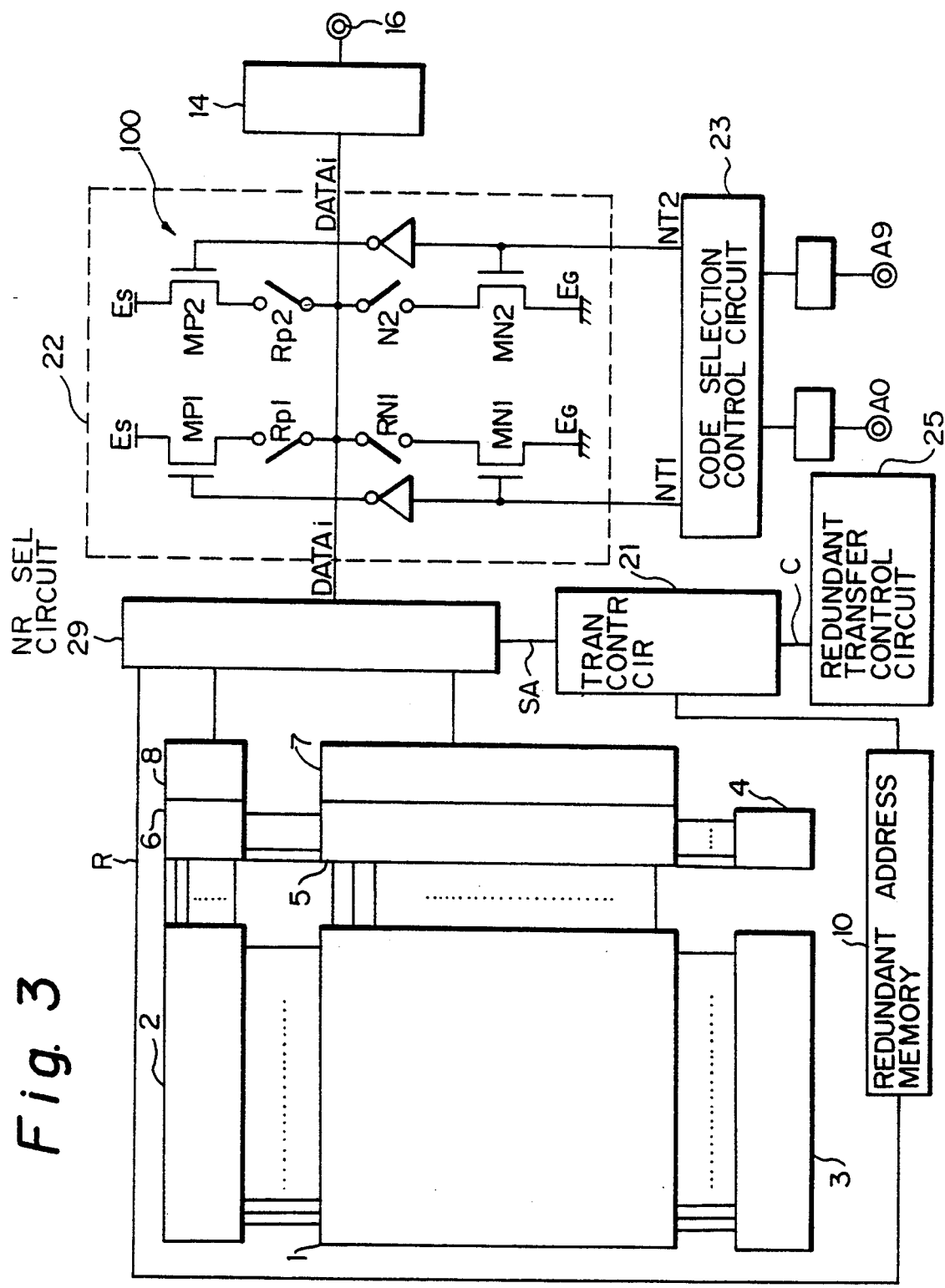
FIG. 3 shows a block diagram of a second embodiment of the present invention.

FIG. 3 shows a block diagram of a second embodiment of the present invention.

The semiconductor memory device according to this embodiment is additionally provided with redundant transfer control circuit 25 which controls reading out the redundant information stored in redundant address memory 10. To this end, NR selector circuit 29 is made up of the same circuit as NR selection circuit 9 and an additional transfer gate (not shown) which transfers redundant test signal R supplied from redundant address memory 10 in response to transfer control signal SA. Redundant transfer control circuit 25, in accordance with an externally supplied instruction, provides redundant Test command C. Transfer control circuit 21, in addition to the operation set forth with reference to FIG. 1, controls NR selector circuit 29 so that redundant test signal R is transferred to common data line Data while transfer control circuit 21 receives the redundant test command C.

In operation, when the operator wishes to know the redundant information stored in redundant address memory 10, he applies a predetermined instruction to redundant transfer control circuit 25 and starts it up. In accordance with the instruction, redundant transfer control circuit 25 supplies redundant test command C to transfer control circuit 21. In response to redundant test command C, transfer control circuit 21 accesses redundant address memory 10 to deliver necessary redundant information or redundant test signals to redundant test signal line R and, at the same time, controls NR selector circuit 29 to transfer redundant test signal R to common data line Data. Since pin #A9 is at 0 volt at this time, redundant test signal R transferred to common data line Data is transmitted to output terminal 16 through output buffer 14 without any intervention of the code generating circuitry.

It is to be understood, however, that although the characteristics and advantages of the present invention have been set forth in the foregoing description, the disclosure is illustrative only, and changes may be made in the shape, size and arrangement of the parts within the scope of the appended claims.

What is claimed is:

1. A semiconductor memory device comprising:
   output means for transmitting an input signal to an external circuit;
   data bus means for transferring an input signal to said output means;
   first means for storing arbitrary data and reading out the stored data at an arbitrary time, said first means comprising:
      normal memory means for storing said arbitrary data and reading out the stored data at said arbitrary time;
      redundant memory means for substituting for a memory area in the normal memory means which has a deficient memory cell; and
      normal/redundant selector means which normally outputs data read from the normal memory means and, when the deficient memory cell is addressed, outputs data stored in the redundant memory means, said normal/redundant selector means having a redundant address memory means for storing said deficient memory cell addresses the normal/redundant selector means delivering the output data to said data bus means which if different than said redundant address memory means, as an output of the first means,
   second means for storing internal information of the first means, said second means having code storing means for storing a fixed code representing said internal information, connected to the data bus means between the output of the normal/redundant selector means and the output means, said code storing means being operable in two modes in accordance with a first external signal, wherein in a first mode, said code storing means is disconnected from said data bus means, thereby allowing the output of the first means to be transferred to the output means without having any delay caused by the code storing means, and in the second mode, said code storing means delivers said fixed code to said data bus means.

2. A semiconductor memory device according to claim 1, wherein said code storing means includes ROM means which stores a test code as said fixed code, a column thereof corresponding to a bit of said test code and a logic state of the row thereof exhibited by activating a word line assigned to the row representing a kind of said test code, and wherein said second means further includes code selection control means which provides a row address signal for selecting a word line of said ROM means in accordance with the first external instruction, said first mode being designated by making all of the word lines inactive, thereby causing said code storing means to be electrically disconnected from said data bus means.

3. A semiconductor memory device as claimed in claim 2, wherein each cell of said ROM means comprises:
   a first FET of a first conductive type with the source applied with a first potential and the gate supplied with said row address signal so that said first FET turns on when the row address signal is active;
   a second FET of a second conductive type with the source applied with a second potential and the gate supplied with said row address signal so that said second FET turns on when the row address signal is active; and
   first and second code-setting means arranged between said data bus means and the drains of said first and second FETs, respectively, for establishing a prescribed logic level of the bit of the test code concerned, each of said first and second code setting means comprising link means for linking the drains of said first and second FETs, respectively, to said data bus means in accordance with said prescribed logic level, said first and second potentials establishing first and second logic levels, respectively, at said data bus means when communicated with said data bus means through said FET and said code-setting means.

4. A semiconductor memory device as claimed in claim 1, wherein said first means includes:
   a normal memory which may include a deficient memory cell;
   a redundant memory for substituting for a predetermined area including said deficient memory cell of said normal memory, said redundant memory being arranged in parallel to the column of said normal memory;
   normal/redundant selector means which receives data read from said normal memory and said redundant memory and transfers the data to the data bus means in response to a transfer control signal;
   a redundant address memory which stores the address of said deficient memory cell;
   transfer control means which compares a supplied address signal for said normal memory with said address stored in said redundant address memory and delivers a transfer control signal such that, when said supplied address signal does not coincide with said address stored in said redundant address memory, said normal/redundant selector means outputs said data read from said normal memory and, when said supplied address signal coincides with said address stored in said redundant address memory, said normal/redundant selector means outputs the data read from said redundant memory in lieu of the data read from the normal memory; and wherein said first means includes a redundant test signal line for transmitting the output of said redundant address memory to said normal/redundant selector means, and further includes redundant transfer control means which provides a redundant test command in accordance with a second external signal, said transfer control means, when it receives said redundant test command, accessing said redundant address memory to deliver the stored address to said redundant test signal line and also controlling said normal/redundant selector means so as to stop outputting said data read from said normal memory and said redundant memory and to transfer the address read from said redundant address memory to said data bus means.

5. A semiconductor memory device as claimed in claim 4, wherein said first means includes a redundant test signal line for transmitting the output of said redundant address memory to said normal.redundant selector means, and further includes redundant transfer control means which provides a redundant test command in accordance with an externally supplied instruction, said transfer control means, when it receives said redundant test command, accessing said redundant address memory to deliver the stored address to said redundant test signal line and also controlling said normal.redundant selector means so as to stop transferring said data read from said normal memory and said redundant memory and to transfer the address read from said redundant address memory to said common data line.

* * * * *

UNITED STATES PATENT AND TRADEMARK OFFICE
CERTIFICATE OF CORRECTION

PATENT NO.    : 5,396,499
DATED         : March 7, 1995
INVENTOR(S)   : Takahiko Urai It is certified that error(s) appears in the above-identified patent and that said Letters Patent is hereby corrected as shown below:

Column 1, Line 48 delete "/f" and insert --of--.

Column 3, Line 4 delete "normal-redundant" and insert --normal-redundant--.

Column 7, lines 38-41 delete "said normal/redundant selector means having a redundant address memory means for storing said deficient memory cell addresses"

Column 7 Lines 43 & 44 delete "which if different than said redundant address memory means,"

Column 7 Line 44 after "first means," insert --said normal/redundant selector means having a redundant address memory means for storing said deficient memory cell addresses;"

Column 7 Line 45 after "second means" insert --which is different than said redundant address memory means,--

Signed and Sealed this

Sixteenth Day of January, 1996

Attest:

BRUCE LEHMAN

Attesting Officer

Commissioner of Patents and Trademarks